United States Patent [19]

Choyke et al.

[11] Patent Number: 4,711,822

[45] Date of Patent: Dec. 8, 1987

[54] METAL CORE PRINTED CIRCUIT BOARDS

[75] Inventors: Wolfgang J. Choyke, Pittsburg; Susan Wood, Wilkinsburg; Luciano C. Scala, Murrysville; Melvin P. Zussman, Wilkinsburg; Leslie A. Doggrell, Penn Township, Westmoreland County; Janet S. Lauer, Wilkinsburg, all of Pa.

[73] Assignee: Westinghouse Electric Corp., Pittsburgh, Pa.

[21] Appl. No.: 818,949

[22] Filed: Jan. 15, 1986

[51] Int. Cl.⁴ .................. B32B 15/08; B32B 27/00; B05D 5/12; B05D 1/18

[52] U.S. Cl. .................. 428/458; 428/209; 428/473.5; 428/901; 430/942; 427/97; 427/98; 427/435

[58] Field of Search .......... 428/209, 901, 458, 473.5; 430/942; 427/97, 98, 435

[56] References Cited

U.S. PATENT DOCUMENTS

| | | | |
|---|---|---|---|
| 4,188,415 | 2/1980 | Takahashi et al. | 427/97 |
| 4,254,172 | 3/1981 | Takahashi et al. | 428/131 |
| 4,293,624 | 10/1981 | Buckley | 430/5 |
| 4,347,304 | 8/1982 | Sakurai et al. | 430/291 |
| 4,599,137 | 7/1986 | Akiya | 156/643 |
| 4,601,916 | 7/1986 | Arachtingi | 427/97 |

*Primary Examiner*—Nancy A. Swisher
*Assistant Examiner*—Patrick J. Ryan
*Attorney, Agent, or Firm*—R. D. Fuerle

[57] ABSTRACT

Disclosed is a method of making a printed circuit board by exposing in a circuit pattern the polymeric surface of a conductive substrate coated with a polymer selected from the group consisting of polyimides, polyamide-imides, polyester-amide-imides, polysulfones, polyphenylene sulfides, and polyphenylene oxides, to an ion beam at an energy of about 50 KeV to about 2 MeV and a fluence of about $10^{15}$ to $10^{18}$ ions/cm². The surface is then wet blasted and the portions of the polymeric surface that have been exposed to the ion beam are electrolessly plated with a metal such as nickel or copper. Also disclosed is a coated substrate comprising a metal or conductive surface and an imide polymeric coating on the surface which can be electrophoretically deposited, a portion of which has been exposed to an ion beam.

22 Claims, 3 Drawing Figures

METAL CORE PRINTED CIRCUIT BOARDS

BACKGROUND OF THE INVENTION

The trend in the electronics industry is toward greater circuit density on circuit boards in order to reduce the size of the device and increase its speed. As the number of components per square inch of circuit board increases, the temperature of the critical components can rise to the point where their performance characteristics begin to degrade. This problem is in part due to the low thermal conductivity of circuit boards, which does not permit the flow of heat away from the components. This problem has been attacked by mounting the circuit boards on aluminum or mild steel sheets or cores which are electrically insulated from the components. At the present time the insulation is provided mostly by epoxies that are applied by a variety of methods, including spraying, dip coating, and fluidized bed. Conductive patterns are then applied on top of the epoxy coating by conventional photolithographic methods. Boards of this type, however, are subject to a number of deficiencies, including cracking of the dielectric coating on thermal cycling, poor hole edge coverage, and low thermal resistance. While materials such as electrophoretically deposited polyimides and polyamideimides overcome several of the deficiencies of epoxies, as they have better thermal properties and better hole edge coverage, until now it has not been possible to obtain good adherence of the conductive copper paths to imide containing coatings.

SUMMARY OF THE INVENTION

We have discovered how to obtain excellent adherence of metal circuit patterns on polymeric films. This is accomplished by exposing the polymeric films to an ion beam having a particular energy and fluence. The surface is then further prepared by a roughening technique. We have discovered that wet blasting will roughen the surface in such a way that a conductive metal circuit pattern can be deposited on it. The portions of the polymeric surface that have been exposed to the ion beam are electrolessly plated with a metal; unexposed portions remain uncoated.

As a result of these discoveries, we have been able to form conductive patterns of copper on polyimide films which are very adherent, while, in the absence of these procedures, copper will not adhere well to polyimides. We can therefore produce a metal core printed circuit board having a polyimide insulating layer which otherwise could not have been made. Because the procedures of this invention do not require flat surfaces, we are also able to make non-planar printed circuit boards, that is, the substrate can be curved to fit a particular configuration such as, for example, inside the receiver of a telephone. And finally, the methods of this invention enable the conductive patterns to be applied to both sides of the board or to succeeding layers of a multi-layer board.

DESCRIPTION OF THE DRAWING

In FIG. 1, a conductive substrate 1 coated with a polymer 2 has portions 3 which have been ion implanted in a circuit pattern. In FIG. 2, the polymer has been roughened by wet blasting, and in FIG. 3 a layer of copper 4 has been electrolessly plated over the ionimplanted portions of the polymer.

Figure 1:
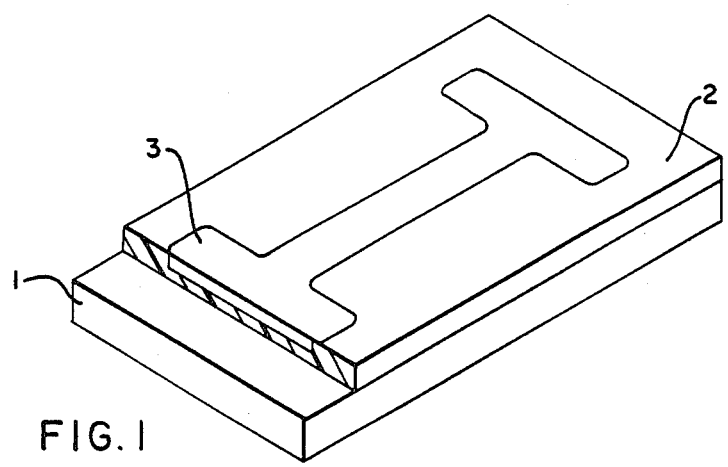
FIG. 1 is an isometric view showing a certain presently preferred embodiment of an ion-implanted polymeric coating on a substrate.
Figure 2:
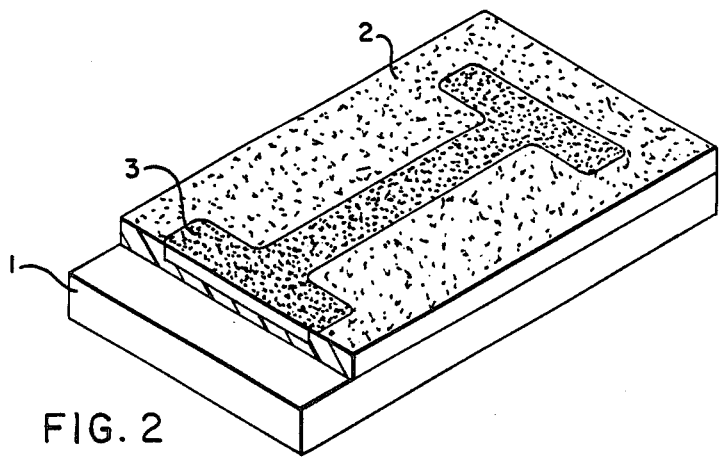
FIG. 2 is an isometric view showing a certain presently preferred embodiment of the substrate in FIG. 1 after roughening.
Figure 3:
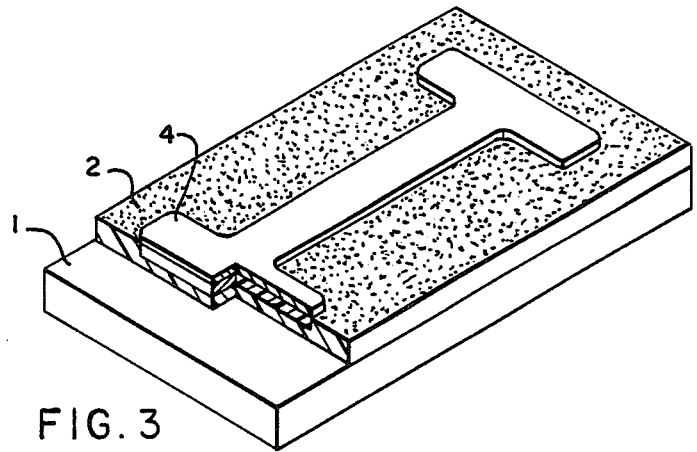
FIG. 3 is an isometric view showing the substrate in FIG. 2 after electroless plating.

The process of this invention preferably employs a conductive substrate of any size or thickness. The substrate may be made of nonmetallic materials, such as graphite, or of metals, such as aluminum, steel, and nickel-plated copper. Aluminum substrates are preferred as aluminum has good adhesion to imide polymers. Alternatively, the polymer can be treated as a free-standing film and need not be on a conductive substrate.

The polymeric film is preferably an imidecontaining polymer, such as polyimide, a polyamide-imide, or a polyester-amide-imide. The film can also be a polysulfone, polyphenylene sulfide, or polyphenylene oxide. The film can be applied to or formed on the substrate by a variety of processes, including dipping the substrate into a solution of the polymer followed by evaporation of the solvent. Electrophoretic deposition is the preferred application process, however, because it covers the through-holes better and produces a more uniform and more pinhole-free coating. Formation of the film on the substrate by spinning is not believed to be a satisfactory method because the resulting films are not sufficiently uniform, nor are they thick enough to resist damage from the ion beam. The film should be at least about 0.5 mil thick or the ion beam may char it, and preferably, it should be less than 5 mils thick, as thicker films are hard to electrophoretically deposit and do not dissipate the heat as well to the underlying substrate. Processes for electrophoretically depositing polyimides are well known in the art and are described in U.S. Pat. Nos. 4,003,812, 4,019,877 and 3,676,383, herein incorporated by reference. Polyimide coated substrates are also commercially available.

In the next step of the process of this invention, the polymeric film is exposed to an ion beam in a predetermined pattern. The designed pattern of exposure may be obtained by placing a mask of an ion-opaque material, such as copper, over the polymeric film prior to exposure by the ion beam. Alternatively, a finely focused ion beam can be used instead of a mask to expose only the desired portions of the polymeric film. Ion beam technology is well known in the art and employs a beam in a vacuum of an ion such as $Ar^+$, $Br^+$, $Cu^{++}$, $Xe^+$, $Kr^+$, or other suitable ions. The preferred ion is $Ar^+$ because $Ar^+$ beams with suitable energies are readily produced. Since the ion beam need not be normal to the surface, it is possible to use curved or otherwise nonlinear films. The energy of the ion beam should be between about 50 KeV and about 2 MeV because lower energy implants require too long an exposure time and the penetration of the beam is too shallow. Higher energy implant, with necessarily decreased beam currents, also require increased implant time and therefore provide no advantage. The fluence of the ion beam should be about $10^{15}$ to about $10^{18}$ ions per square centimeter because a lesser fluence does not modify the surface of the polymer sufficiently and greater fluence may result in the degradation of the polymer.

In the next step of the process of this invention, the surface of the polymer is roughened. Surface roughening by chemical etching, sputtering, and lap grinding has been found to be unsuitable in that it does not result in successful electroless plating of metal on the polymeric film. Excellent plating and adherence are obtained, however, by a process known as wet blasting. In wet blasting, fine grit particles in a liquid such as water are propelled at high speed at the surface. A typical grit size is about 50 to about 5000 mesh. It has been found that a suitable exposure time to vapor blasting is about 5 seconds to about 1 minute as less time is ineffective in roughening the surface sufficiently and more time may result in damage to the surface.

In the next step of the process of this invention, the polymeric film is electrolessly plated. Electroless plating should be performed within about 1 week of the exposure of the surface to the ion beam or the entire surface may be plated rather than only those portions that have been exposed to the ion beam. Electroless plating is also a process well known in the art, and commercially available materials and procedures may be used. Any metal that can be electrolessly plated can be used to form a conductive pattern on the polymeric film, including copper, nickel, and gold. Copper is preferred because it is a very solderable metal. In a typical electroless plating procedure, the substrate is immersed in a sensitizer and is then rinsed and immersed in a catalyst solution. After rinsing, the substrate is immersed in a coating solution from which the metal plates onto the polymeric film. The composition of these solutions is usually regarded as proprietary by the companies providing them, and the time and temperature of immersion is given by the companies when the solutions are sold.

As an optional final step in the process of this invention, additional metal may be electrodeposited over the electrolessly deposited metal in order to thicken the deposit. This may or may not be necessary, depending upon the thickness of the electroless deposit and the conductivity requirements for the circuit board.

The method of this invention may be used to apply and treat polymeric coatings on both sides of a conductive substrate. In addition, after a circuit pattern has been completed on one side of a substrate, additional insulating layers and circuit patterns can be built up on top of the first polymeric coating.

The following examples further illustrate this invention.

EXAMPLE 1

Substrates were prepared of 2 cm×2 cm squares of aluminum having one surface electrophoretically coated with a polyimide sold by DuPont under the trade designation "RC-5019" or with a polyamide-imide sold by Amoco under the trade designation "TORLON" to a thickness of about 1 mil (25 microns). Metal masks were fabricated from copper sheets 5 mils thick in a tree structure as shown in the drawings. Ion implantation through the mask was performed in a 2 MeV Van de Graaff accelerator. The specimens were individually clamped to an oil-cooled specimen holder with a cryogenically pumped shield, yielding a vacuum of about $10^{-8}$ Torr in the vicinity of the sample. Specimens were implanted with 2 MeV $Ar^+$ ions to a fluence of $5 \times 10^{16}/cm^2$. The estimated projected range of the ions ($R_P$) was about 0.8 microns.

After implantation, resistance arms across the exposed pattern and across the length of the pattern were measured with a precision ohm-meter using an applied voltage of about 30 volts. Pressed indium contacts were used and subsequently more permanent electrical contacts and leads were mounted to the specimens using a silver epoxy via standard semiconductor procedures.

Limited characterization of the ion-implanted material was performed by optical and scanning electron microscopy (SEM). The SEM was done using a 6 kV accelerating voltage and a tilt of 30°. No conducting surface coating of the specimen was employed.

Visually, the ion-implanted regions had a metallic-like appearance and were contained within the polymer, i.e., this was not a simple charring effect and these areas were not removed by gentle rubbing. The definition in the simpler pattern generated by the polyimide was much better than that of the tree structure obtained in the polyamide-imide because of superior definition in the mask used for the former. There was some evidence of blistering in one area of the implant and this material with the remainder of the implanted surface was entirely free of any microstructural features. The absence of any charging phenomena in the ion-implanted areas was a clear indication that this material was no longer an insulator, and resistance measurements confirmed this observation. For the polyamide-imide material, resistance across the tree was about $10^4$ ohms and for the polyimide, resistance across the tree was about 3000 ohms. The estimated resistivity was about $10^{-2}$ to $10^{-3}$ ohms/cm. Resistivity of the unimplanted material was not determined, but was estimated to be about $10^{12}$ to $10^{14}$ ohms/cm across a distance equivalent to that of the tree.

EXAMPLE 2

An aluminum panel 6 inches by 3 inches was coated to 1 mil thick on one surface with electrophoretically deposited polyimides sold by DuPont under the trade designation "RC-5019." A 5 inch by 2 inch portion of the coated panel was bombarded as in Example 1 with 100 KeV $Ar^+$ ions at a fluence of $1 \times 10^{17}$ ions/$cm^2$. A 0.25 inch border of the panel was left implanted.

Portions of the implanted coated panels were subjected to various preplating treatments prior to attempted electroless deposition of nickel. Neither chromic acid/hydrofluoric acid nor 50% NaOH etches were successful. However, a light wet blasting improved surface wettability and facilitated nickel deposition. The wet blasting slurry consisted of 220 mesh particles of aluminum oxide in water blasted at the surface for 45 seconds.

The electroless deposition procedure utilized chemicals proprietary to the Richardson Company and consisted of 15 seconds soaking in "ARP 28" acid pickle at room temperature, 2 minutes in "NICKLAD 261" sensitizer 90° F., 2 minutes in "NICKLAD 262" at 120° F., and 15 minutes in "NICKLAD 752" electroless nickel at 150° F. Subsequent experiments showed that the acid pickle was not necessary to obtain a good coating. Continuous, uniform nickel coatings were obtained only on vapor blasted, ion bombarded surfaces. Non-irradiated or non-vapor blasted surfaces received little or no nickel coating. The nickel coated implanted regions showed good conductivity consistent with the formation of continuous metallic paths on the polyimide surface. The resistance of the strip was about $1 \times 10^{-2}$ ohms/cm.

EXAMPLE 3

Three inch by six inch aluminum panels were electrophoretically coated with a polyamide-imide sold by P. D. George Co. under the designation "No. 981" to a thickness of 25 mils. The panels were cut up into small pieces and were ion implanted with argon at a fluence of $1 \times 10^{17}$ ions/cm$^2$ and an energy of 100 KeV. The surfaces were then wet blasted using a slurry containing 220 mesh alumina particles at a pressure of 25 psi for about one second/cm$^2$. When the color changed from black to dark brown and the surface wetted, the treatment was ended.

Within a few hours of the ion implantation, electroless deposition of copper was begun. The panels were immersed for two minutes at 25° C. in a 10% solution (believed to be of a tip compound) sold by Allied Kelite under the trade designation "NICKLAD 261." This was followed by a three minute rinse in deionized water. The panels were then stirred for two minutes in a 10% catalyst solution (believed to be palladium) sold by Allied Kelite under the trade designation "NICKLAD 261" at 44° C., followed by a five minute rinse in deionized water. Finally, the panels were immersed for 12 minutes at room temperature in a proprietary "Cuposit" copper solution sold by Shipley Company which consisted of five parts "328A," five parts "328Q," one part "328C," and 29 parts deionized water. An examination of the panels showed that only the implanted areas were copper plated, with good identification from the unimplanted areas. The experiment was repeated except that the panels were permitted to sit for several weeks before electroless plating. The result was that the entire panel plated with copper.

The experiment was repeated using various surface treatments. The following table gives the surface treatments and the results.

| SURFACE TREATMENT | RESULT |
| --- | --- |
| None | No plating in any area |
| 10 minutes argon plasma sputtering | Entire sample plated |
| Eight hours of stirring in a diamond polishing solution sold by Vibromet Company. | No plating in any area |
| 8 minutes in 80% hydrazine in water and ethylene diamine in a 70 to 30 volume ratio of the hydrazine solution to the ethylene diamine | Unimplanted areas plated poorly while the implanted areas did not plate |

We claim:

1. A method of making a printed circuit board comprising:
   (A) exposing a portion of a polymeric film applied by a conventional technique other than spin coating to an ion beam at an energy of about 50 KeV to about 2 MeV, at a fluence of about $10^{15}$ to about $10^{18}$ ions/cm$^2$, where said polymeric film is selected from the group consisting of polyimides, polyamideimides, polyester-amide-imides, polysulfones, polyphenylene sulfides, and polyphenylene oxides;
   (B) wet blasting said polymeric film; and
   (C) electrolessly plating, with a metal, the portions of said polymeric film that were exposed to said ion beam.

2. A method according to claim 1 wherein said polymeric film is a coating on a conductive substrate.

3. A method according to claim 2 wherein said conductive substrate is aluminum.

4. A method according to claim 1 wherein said polymeric film is at least about 0.5 mils thick.

5. A method according to claim 1 wherein said polymeric film is an electrophoretically deposited coating on a conductive substrate.

6. A method according to claim 1 wherein said polymeric film is exposed to said ion beam in a circuit pattern obtained by placing a mask over said polymeric coating.

7. A method according to claim 1 wherein said polymeric film is exposed to said ion beam in a circuit pattern obtained by using a finely focused ion beam.

8. A method according to claim 1 wherein said ion beam uses argon ions.

9. A method according to claim 1 wherein said polymeric film is electrolessly coated within seven days after exposure to said ion beam.

10. A method according to claim 1 wherein said wet blasting lasts from about 5 to about 60 seconds.

11. A method according to claim 1 wherein said exposed polymeric film is electrolessly plated with copper.

12. A method according to claim 1 including the additional last step of electrodepositing metal on said electrolessly plated metal.

13. A method according to claim 1 wherein said polymeric film is an imide-containing polymer.

14. A product made according to the method of claim 1.

15. A method of making a metal core printed circuit board comprising:
   (A) electrophoretically coating a metal substrate with a polymer selected from the group consisting of polyimides, polyamide-imides, polyester-amide-imides, and mixtures thereof, to a thickness of about 0.5 to about 5 mils;
   (B) exposing said polymer on said substrate to an ion beam in a circuit pattern, said ion beam having an energy of about 50 KeV to about 2 MeV and a fluence on said surface of about $10^{15}$ to about $10^{18}$ ions/cm$^2$;
   (C) wet blasting said polymer on said surface for about 5 to about 60 seconds; and
   (D) within about seven days after exposing said polymer to said ion beam, electrolessly plating a metal on the portions of said polymer exposed to said ion beam.

16. A produce made according to the method of claim 15.

17. A coated substrate comprising:
   (A) a metal substrate; and
   (B) an imide-containing polymeric coating applied by a conventional technique other than spin coating on said substrate, only a portion of which has been exposed to an ion beam.

18. A coated substrate comprising:
   (A) a conductive surface; and
   (B) an electrophoretically deposited imide polymeric coating on said surface, only a portion of which has been exposed to an ion beam.

19. A coated substrate comprising:
   (A) a conductive surface; and
   (B) an imide polymeric coating applied by a conventional technique other than spin coating on said surface, only a portion of which has been exposed to an ion beam, then treated by wet blasting.

20. A substrate according to claim 19 including a metal coating electrolessly deposited over said portion.

21. A method according to claim 1 wherein said polymeric film is free-standing.

22. A coated substrate according to claim 19 wherein said portion exposed to said ion beam forms a circuit pattern.

* * * * *